United States Patent
Tsuji

(10) Patent No.: US 7,977,129 B2
(45) Date of Patent: Jul. 12, 2011

(54) METHOD FOR MANUFACTURING SEMICONDUCTOR OPTICAL DEVICE

(75) Inventor: Yukihiro Tsuji, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/694,629

(22) Filed: Jan. 27, 2010

(65) Prior Publication Data

US 2010/0197057 A1 Aug. 5, 2010

(30) Foreign Application Priority Data

Feb. 2, 2009 (JP) ................................. 2009-021587

(51) Int. Cl.
*H01L 21/00* (2006.01)
(52) U.S. Cl. .................... 438/32; 438/712; 257/E21.249
(58) Field of Classification Search .................... 438/32, 438/712
See application file for complete search history.

(56) References Cited

U.S. PATENT DOCUMENTS

| 6,962,771 | B1 * | 11/2005 | Liu et al. | 430/317 |
| 7,781,332 | B2 * | 8/2010 | Arnold et al. | 438/639 |
| 2004/0152328 | A1 * | 8/2004 | Tsai et al. | 438/710 |
| 2009/0280438 | A1 * | 11/2009 | Kohno et al. | 430/323 |
| 2010/0266965 | A1 * | 10/2010 | Schmid et al. | 430/323 |

FOREIGN PATENT DOCUMENTS

JP 5-67848 3/1993

OTHER PUBLICATIONS

Kinoshita et al.., "Etch-Profile Control of Quarter-Micron Resist Pattern Using $O_2$ Super-magnetron Plasma Added with $N_2$ Gas", Technical Report of IEICE, SDM94-114, (Oct. 1994), pp. 21-26 with English language translation.

* cited by examiner

*Primary Examiner* — Alexander G Ghyka
(74) *Attorney, Agent, or Firm* — Smith, Gambrell & Russell, LLP

(57) ABSTRACT

A method for manufacturing a semiconductor optical device having an optical grating, includes the steps of: forming a semiconductor layer, an insulating layer and a first resin layer not containing silicon (Si); forming a second resin layer containing silicon (Si) on the first resin layer wherein the second resin layer has a pattern corresponding to the optical grating; etching the first resin layer using the second resin layer as a mask by a reactive ion etching that uses a mixed gas of oxygen and nitrogen where the first resin layer is cooled down to a first temperature during etching to form a protective layer on a side face of the etched first resin layer; increasing the temperature of the first resin layer upto a second temperature higher than the first temperature; etching the insulating layer using the patterned first resin layer as a mask; and forming the optical grating on the semiconductor layer by etching the semiconductor layer using the patterned insulating layer as a mask.

11 Claims, 8 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device having an optical grating.

2. Description of the Related Art

Japanese Unexamined Patent Application Publication No. 5-67848 discloses a method for manufacturing an optical semiconductor device having an optical grating. In the method for manufacturing an optical semiconductor device, a reactive ion etching method that uses methane gas or ethane gas is used for forming an optical grating.

In non-Patent Document 1 (Kinoshita et al. Etch-Profile Control of Quarter-Micron Resist Pattern Using $O_2$ Supermagnetron Plasma Added with $N_2$ Gas, Technical Report of IEICE, The Institute of Electronics, Information and Communication Engineers, SDM94-114 (1994-10), pp 21-26.), there is described a method for forming a resist pattern for manufacturing an ultra-large-scale integrated circuit (ULSI) formed on a Si semiconductor. Specifically, the method includes the following steps. A two-layer resist composed of a resist layer not containing silicon (Si) having a thickness of 1.2 μm and a resist layer containing silicon (Si) is directly applied on a silicon substrate. The resist layer containing Si is an upper layer disposed on the resist layer not containing silicon (Si). The resist layer containing Si is processed to form a pattern having a narrow pattern width of about 0.5 μm and large thickness of 1.2 μm, or a pattern having a high aspect ratio (the ratio of pattern width to thickness of the resist). Subsequently, the resist layer not containing Si is etched by a plasma etching method that uses oxygen gas mixed with nitrogen gas, using the resist layer containing Si as a mask. Consequently, the pattern formed on the resist layer containing Si is transferred to the resist layer not containing Si, and a pattern having a high aspect ratio is formed. Non-Patent Document 1 also discloses that the resist layer not containing Si is etched while the silicon substrate is cooled.

SUMMARY OF THE INVENTION

It is important to form an optical grating having a desired pattern with high precision and reproducibility in order to manufacture a semiconductor optical device having an optical grating such as a distributed feedback laser (DFB laser). An interference lithography method or an electron beam lithography method has been used to form an optical grating. In these methods, an optical grating pattern is formed on a resist layer composed of a single layer, and the pattern is transferred to a semiconductor layer.

The surface of a compound semiconductor substrate used for manufacturing a semiconductor optical device having an optical grating is not flat but has a roughness of about 0.1 μm. The optical grating pattern has periodic pattern of projections and recesses having a period of about 0.1 μm. When an optical grating is formed on the surface of the compound semiconductor substrate having such a roughness using a resist layer composed of a single layer, the pattern width of the optical grating is varied due to the roughness of the substrate. To reduce the variation in pattern width of the optical grating and to improve the pattern precision of the optical grating, use of a two-layer resist composed of a resist layer not containing Si and a resist layer containing Si has been investigated. Specifically, an insulating layer is formed on a semiconductor layer on which an optical grating is to be formed, and a two-layer resist composed of a resist layer not containing Si and a resist layer containing Si is applied on the insulating layer. The resist layer containing Si is an upper layer disposed on the resist layer not containing Si in the two-layer resist. After the resist layer containing Si is patterned into a shape (line-and-space pattern) corresponding to the optical grating, the resist layer not containing Si is etched by a reactive ion etching method using the resist layer containing Si as a mask. Thus, the pattern of the optical grating formed on the resist layer containing Si is transferred to the resist layer not containing Si. The insulating layer is then etched using the patterned resist layer not containing Si as a mask. The pattern of the optical grating formed on the resist layer not containing Si is transferred to the insulating layer. Subsequently, the two-layer resist is removed, and the layer on which an optical grating is to be formed is etched using the patterned insulating layer as a mask to form an optical grating on the layer. By forming the resist layer not containing Si on the surface of the substrate, the roughness of the surface can be reduced. The resist layer containing Si is formed on the resist layer not containing Si having such a flat surface and the optical grating pattern is formed, whereby an optical grating whose variation in pattern width is reduced can be formed on the compound semiconductor substrate having roughness. Herein, there is adopted a method in which an insulating layer is formed on the surface of a semiconductor layer in advance without directly forming a two-layer resist mask on the surface of the semiconductor layer, and the two-layer resist mask is then formed on the insulating layer. This is because, when the two-layer resist mask is removed after an optical grating is formed on the semiconductor layer, the resist mask can be prevented from being left on the surface of the semiconductor layer.

However, it has been found that, when the two-layer resist is used for forming an optical grating, there is a problem in that the shape of the optical grating is varied. It has been also found that variation in the shape of the optical grating is caused by adhesion of silicon oxide to the insulating layer or the like when the resist layer not containing Si is etched. Furthermore, it has been discovered that, since oxygen gas is used as an etching gas when the lower resist layer not containing Si is etched, silicon oxide that adheres to the insulating layer or the like is produced with a reaction between the oxygen gas and silicon in the upper resist layer containing Si.

A method in which $CF_4$ gas is mixed in the etching gas has been investigated to ease the problem caused by the production of silicon oxide. In such a method, silicon oxide produced is removed through the reaction between silicon oxide and the $CF_4$ gas in the plasma gas. However, since isotropic etching tends to be performed if oxygen gas is used as an etching gas, the side face of the patterned resist layer not containing Si is also subjected to side etching. Thus, it has been found that the shape and pitch of the optical grating formed is varied due to such side etching.

Non-Patent Document 1 discloses that the side etching is suppressed in the process of etching the resist layer not containing Si by cooling the silicon substrate. However, as a result of a supplementary examination of the etching method disclosed in non-Patent Document 1, it has been discovered that a reaction product between carbon atoms and nitrogen gas adheres to the side face of the patterned resist layer not containing Si with a thickness of about 50 to 100 nm when the resist layer not containing Si is etched. The reaction product between carbon atoms and nitrogen gas functions as a protective layer and the side etching is accordingly suppressed.

If the two-layer resist patterned by the method disclosed in non-Patent Document 1 is formed on the insulating layer to form an optical grating having a line-and-space pattern, the substantial line width increases and the space width decreases by the thickness of the protective layer. When the insulating layer is etched by using the two-layer resist patterned by the method disclosed in non-Patent Document 1 as an etching mask, the pattern of the insulating layer is varied. The line width and the space width of an optical grating of a DFB laser or the like are, for example, about 100 nm. The line width and the space width of the optical grating are nearly equal to the thickness of the protective layer. Thus, variation in the pattern caused by such a protective layer cannot be neglected.

The method for manufacturing a semiconductor optical device according to the present invention has a feature that the method includes the steps of:

(1) forming a semiconductor layer on a semiconductor substrate;

(2) forming an insulating layer on the semiconductor layer;

(3) forming a first resin layer not containing silicon (Si) on the insulating layer;

(4) forming a second resin layer containing silicon (Si) on the first resin layer wherein the second resin layer has a pattern corresponding to the optical grating;

(5) etching the first resin layer using the second resin layer as a mask by a reactive ion etching that uses a mixed gas of oxygen ($O_2$) and nitrogen ($N_2$) where the first resin layer is cooled downto a first temperature during etching to form a protective layer on a side face of the etched first resin layer;

(6) increasing the temperature of the first resin layer upto a second temperature higher than the first temperature;

(7) etching the insulating layer using the patterned first resin layer as a mask; and (8) forming the optical grating on the semiconductor layer by etching the semiconductor layer using the patterned insulating layer as a mask.

According to the method for manufacturing a semiconductor optical device of the present invention, the mixed gas of the oxygen ($O_2$) and nitrogen ($N_2$) is used in the step of etching the first resin layer by a reactive ion etching. The reaction between the oxygen gas and silicon in the second resin layer is suppressed. This reduces the production of silicon oxide. Furthermore, at least part of silicon oxide produced is removed due to a sputtering effect provided from nitrogen gas plasma. These suppress the variation in the shape and pitch of the optical grating caused by the production of silicon oxide.

Furthermore, in the step of etching the first resin layer, the first resin layer is cooled downto a first temperature during etching. A protective layer is formed on a side face of the etched first resin layer. The side etching of the first resin layer caused by oxygen plasma is suppressed by the protective layer. This suppresses the variation in the shape and pitch of the optical grating caused by side etching.

If the insulating layer is etched while the protective layer is formed on the side face of the first resin layer, the pattern formed on the insulating layer is varied. However, the inventors of the present invention have found that the protective layer can be volatilized by increasing temperature. Thus, in the method for manufacturing a semiconductor optical device of the present invention, the protective layer is removed by increasing the temperature of the first resin layer upto a second temperature higher than the first temperature after the step of etching the first resin layer. Thus, variation in the pattern of the insulating layer caused by the presence of the protective layer is suppressed, which suppresses the variation in the shape and pitch of the optical grating.

In the step of etching the first resin layer, the protective layer is composed of a reaction product between carbon atoms and the nitrogen gas. Carbon atoms in the first resin layer react with nitrogen gas in the etching gas, and a reaction product is produced by cooling downto the first temperature the first resin layer during etching. The first temperature is lower than or equal to the volatilization temperature of the reaction product. After the step of etching the first resin layer, the protective layer is easily removed by increasing the temperature of the first resin layer upto the second temperature which is higher than or equal to the volatilization temperature of the reaction product. Preferably, the protective layer formed on the side face of the etched first resin layer is volatilized after exposing a surface of the insulating layer in the step of etching the first resin layer.

In the step of increasing the temperature of the first resin layer, the temperature of the first resin layer is risen at a lower pressure than atmospheric pressure in a reactive ion etching apparatus after the step of etching the first resin layer.

In the step of etching the first resin layer, the mixing ratio of the oxygen gas and the nitrogen gas is preferably within the range of 1:1 to 1:10 in terms of a partial pressure ratio. The reaction between the oxygen gas and silicon in the second resin layer containing Si can be sufficiently suppressed while the etching rate of the first resin layer not containing Si is maintained within a normal range. Consequently, the first resin layer can be easily etched and variation in the shape and pitch of the optical grating can be suppressed.

In the step of etching the first resin layer, the first temperature is preferably lower than or equal to 0° C. and the second temperature is higher than or equal to 0° C. Consequently, the protective layer is formed on the side face of the etched first resin layer more easily. The protective layer is easily removed after etching the first resin layer.

In the step of etching the first resin layer, the first resin layer is preferably etched at a pressure of 0.1 to 1 Pa. This can sufficiently lengthen the mean free path of ions and radicals in plasma while plasma discharge is stabilized. Consequently, the first resin layer can be stably etched while side etching is suppressed.

In the step of forming the first resin layer on the insulating layer, the first resin layer has a flattened surface by compensating a roughness of the surface of the semiconductor substrate.

The step of forming the second resin layer further includes the steps of:

(4a) forming the pattern corresponding to the optical grating on the first resin layer by etching the first resin layer to the middle of the thickness thereof wherein the pattern has periodic recesses;

(4b) forming the second resin layer on the first resin layer wherein the second resin layer fully fills the periodic recesses of the first resin layer;

(4c) etching the second resin layer until a surface of the first resin layer is exposed.

In the step of forming the second resin layer, the periodic pattern is made of the first resin layer and the second resin layer which are alternately disposed. When the first resin layer is selectively etched by using the patterned second resin as a mask, carbon atoms in the etched first resin layer 11 react with nitrogen gas in the etching gas. Therefore, the protective layer is easily formed on the side face of the etched first resin layer.

The above-described object and other objects, features, and advantages of the present invention will become more apparent from the following detailed description of preferred embodiments of the present invention with reference to the attached drawings.

DESCRIPTION OF THE PREFERRED EMBODIMENTS

Figure 1A:
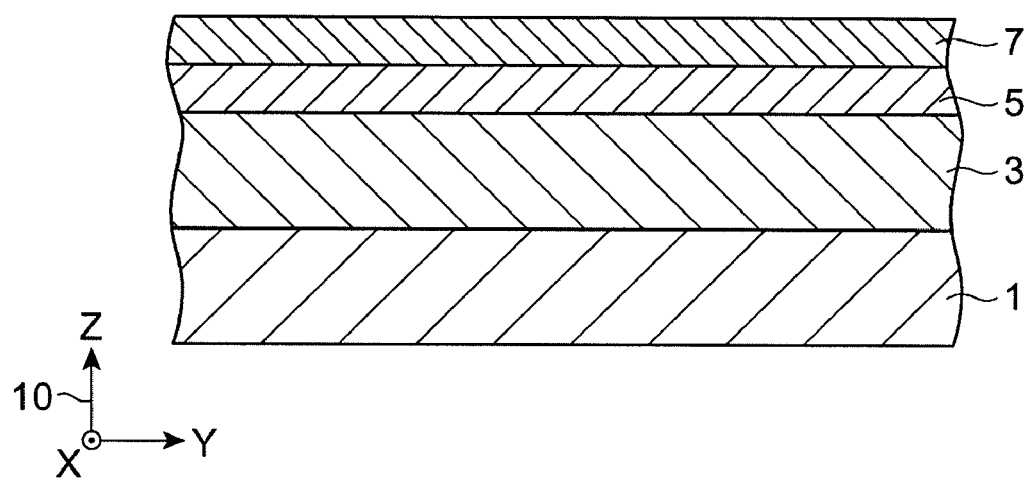
FIG. 1A is a schematic sectional view showing a method for manufacturing a distributed feedback laser according to this embodiment.

A method for manufacturing a semiconductor optical device according to an embodiment will now be described in detail with reference to the attached drawings. In the drawings, the same elements are designated by the same reference numerals wherever possible. In the drawings, the size ratio within a structural element or between structural elements is arbitrary for easy understanding of the drawings.

A method for manufacturing a distributed feedback laser (DFB laser) is described as a method for manufacturing a semiconductor optical device according to this embodiment. FIGS. 1A to 3B and 5A to 8C are schematic sectional views showing a method for manufacturing a DFB laser according to this embodiment. In the drawings other than FIG. 4, a rectangular coordinate system 10 is provided.

As shown in FIG. 1A, a lower cladding layer 3, an active layer 5, and an optical grating layer 7 are grown on a principal surface of a semiconductor substrate 1 by, for example, a metal-organic chemical vapor deposition (MOCVD) method. In FIG. 1A, an X axis and a Y axis are set in directions parallel to the principal surface of the semiconductor substrate 1.

The semiconductor substrate 1 is a first conductive-type (e.g., n-type) group III-V compound semiconductor substrate. For example, the semiconductor substrate 1 is an InP substrate doped with tin (Sn). The lower cladding layer 3 is a first conductive-type group III-V compound semiconductor layer. For example, the lower cladding layer 3 is made of n-type InP doped with Si. The active layer 5 has a multi quantum well (MQW) structure or a single quantum well (SQW) structure composed of a group III-V compound semiconductor such as GaInAsP or AlGaInAs. The optical grating layer 7 is a second conductive-type group III-V compound semiconductor layer. For example, the optical grating layer 7 is made of p-type GaInAsP doped with Zn. When the first conductive-type is an n-type, the second conductive-type is a p-type.

Figure 1B:
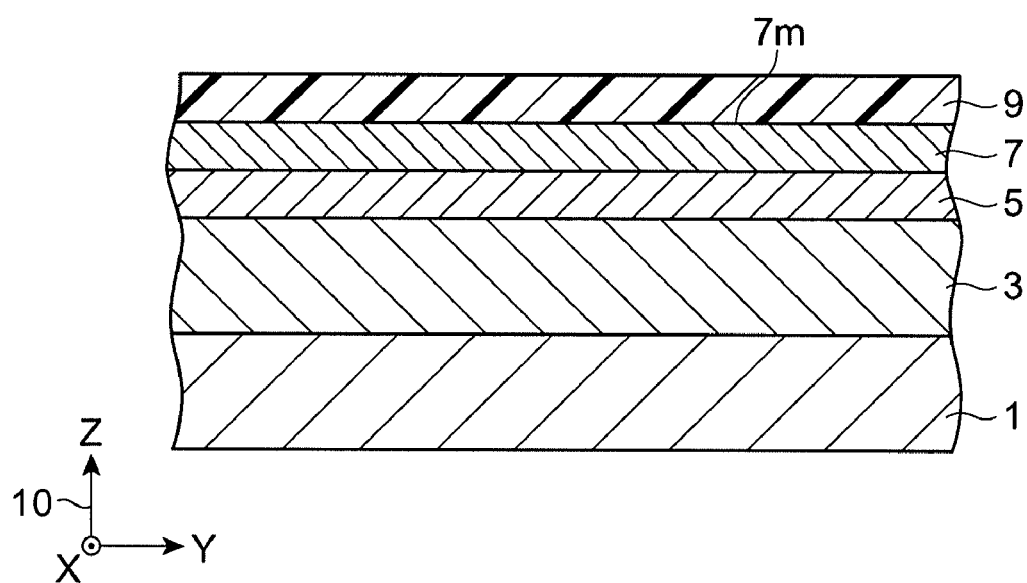
FIG. 1B is a schematic sectional view showing the method for manufacturing a distributed feedback laser according to this embodiment, the step shown in FIG. 1B being performed after the step shown in FIG. 1A.

As shown in FIG. 1B, an insulating layer 9 is formed on a surface 7m of the optical grating layer 7 by, for example, a plasma vapor deposition method. The thickness of the insulating layer 9 is, for example, 20 to 50 nm. The insulating layer 9 can be composed of a material such as silicon oxide ($SiO_2$), silicon oxynitride (SiON), or silicon nitride (SiN).

Figure 2A:
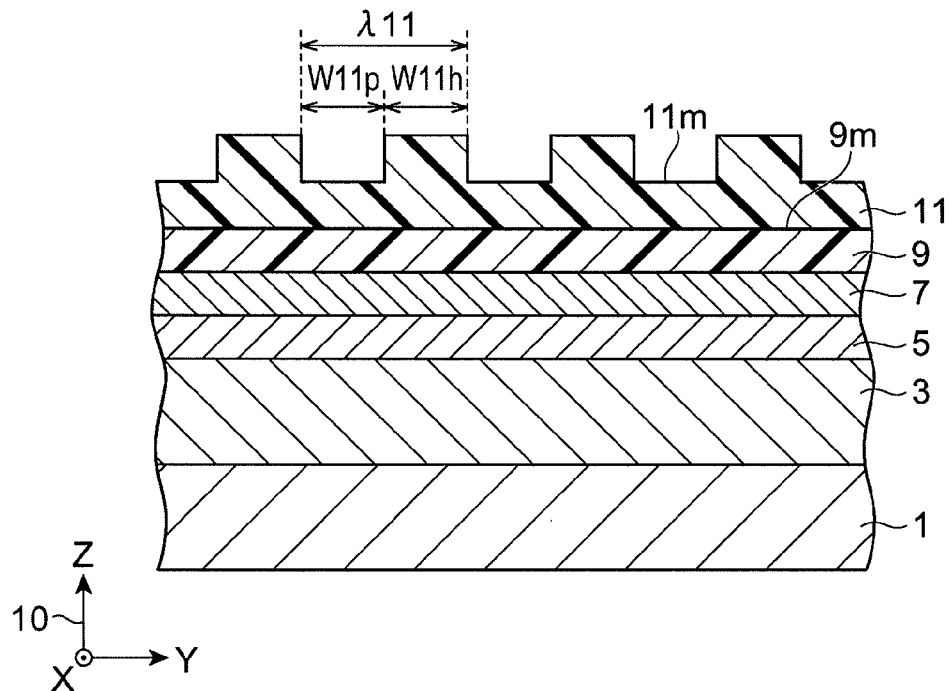
FIGS. 2A and 2B are schematic sectional views showing the method for manufacturing a distributed feedback laser according to this embodiment, the step shown in FIG. 2A being performed after the step shown in FIG. 1B.

As shown in FIG. 2A, a first resin layer not containing Si 11 is formed on a surface 9m of the insulating layer 9. The thickness of the first resin layer 11 needs only to be a certain thickness or more that can compensate the roughness of the surface of the semiconductor substrate 1. The semiconductor substrate 1 made of III-V compound semiconductor such as GaAs or InP has a rougher surface than that of a Si substrate. The roughness of the surface of the semiconductor substrate made of III-V compound semiconductor is, for example, about 0.3 μm. The semiconductor layers and the insulating layer formed on the semiconductor substrate having such a rough surface also have a rough surface with a similar roughness of, for example, about 0.3 μm. Even if the semiconductor substrate has such a rough surface, the first resin layer 11 has a flattened surface by compensating the roughness of the surface of the semiconductor substrate. The upper limit of the thickness of the first resin layer 11 is about 1 μm. Since the pattern width for forming an optical grating is as extremely small as about 100 nm, etching gas cannot sufficiently reach the etching grooves of the first resin layer 11 when the first resin layer 11 has a large thickness of 1 μm or more. When the first resin layer 11 having a large thickness of 1 μm or more is etched, the etching depth is varied in a plane of the semiconductor substrate and part of the first resin layer 11 is left without being etched. As a result, it is difficult to uniformly etch the insulating layer 9 in a plane when the first resin layer 11 formed on the insulating layer 9 has a large thickness of 1 μm or more. A line-and-space pattern for forming an optical grating is formed on a surface 11m of the first resin layer 11. For example, the line-and-space pattern of the first resin layer 11 can be formed by applying a resin not containing Si on the surface 9m of the insulating layer 9 by spin coating and then by processing by a photolithography method or a nanoimprint lithography method.

The line-and-space pattern includes a line portion that extends in an X axis direction and a space portion that extends in the X axis direction. The line portion and the space portion are alternately and periodically arranged in a Y axis direction. The width W11h of the line portion in the Y axis direction is substantially equal to the width W7h of a recess of an optical grating 7g to be formed in a later step (refer to FIG. 6A). The width W11h is, for example, 100 to 120 nm. Similarly, the width W11p of the space portion in the Y axis direction is substantially equal to the width W7p of a projection of the optical grating 7g to be formed in a later step (refer to FIG. 6A). The width W11p is, for example, 100 to 120 nm. The period λ11 of the line-and-space pattern is substantially equal to the period λ7 of the optical grating 7g to be formed in a later step (refer to FIG. 6A). The first resin layer 11 can be composed of, for example, an acrylic UV curable resin.

Figure 2B:
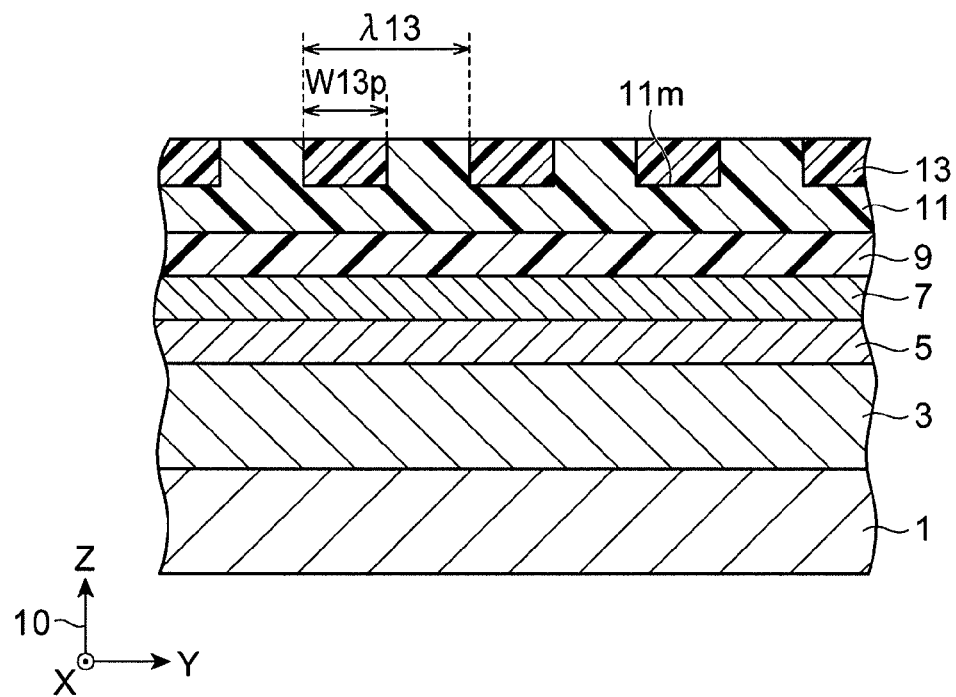

As shown in FIG. 2B, a second resin layer containing Si 13 is formed such that the recesses of the line-and-space pattern of the first resin layer 11 are filled. The second resin layer 13 can be formed as follows, for instance. First, a resin containing Si is applied on the entire surface of the first resin layer 11 having the line-and-space pattern by spin coating. The thickness of the second resin is more than the depth of the recesses of the line-and-space pattern on the first resin layer 11. The resin containing Si fully fills the recesses of the line-and-space pattern. The resin containing Si is evenly etched by a reactive ion etching until the line portion of the line-and-space pattern of the first resin layer 11 is exposed. Thus, the second resin layer 13 is formed. As a result, the periodic pattern made of the first resin layer 11 and the second resin layer 13 is formed on the insulating layer 9 as shown in FIG. 2B. The surfaces of the first resin layer 11 and the second resin layer 13 are exposed and the first and second resin layer is alternately and periodically arranged in a Y axis direction. For example, $CF_4$ gas can be used as gas used in the reactive ion etching during the etching of the resin containing Si. The thus-formed second resin layer 13 has a pattern constituted by a plurality of lines that are periodically arranged in the Y axis direction and extend in the X axis direction. The second resin layer 13 masks part of the surface 11m of the first resin layer 11.

The width W13p of the second resin layer 13 in the Y axis direction is substantially equal to the width W7p of a projection of the optical grating 7g to be formed in a later step (refer to FIG. 6A). The width W13p is, for example, 100 to 120 nm. The period λ13 of the line pattern of the second resin layer 13 is substantially equal to the period λ7 of the optical grating 7g to be formed in a later step (refer to FIG. 6A). The second resin layer 13 can be composed of, for example, an organic silicon compound whose composition ratio of Si is 20% or more.

Figure 3:
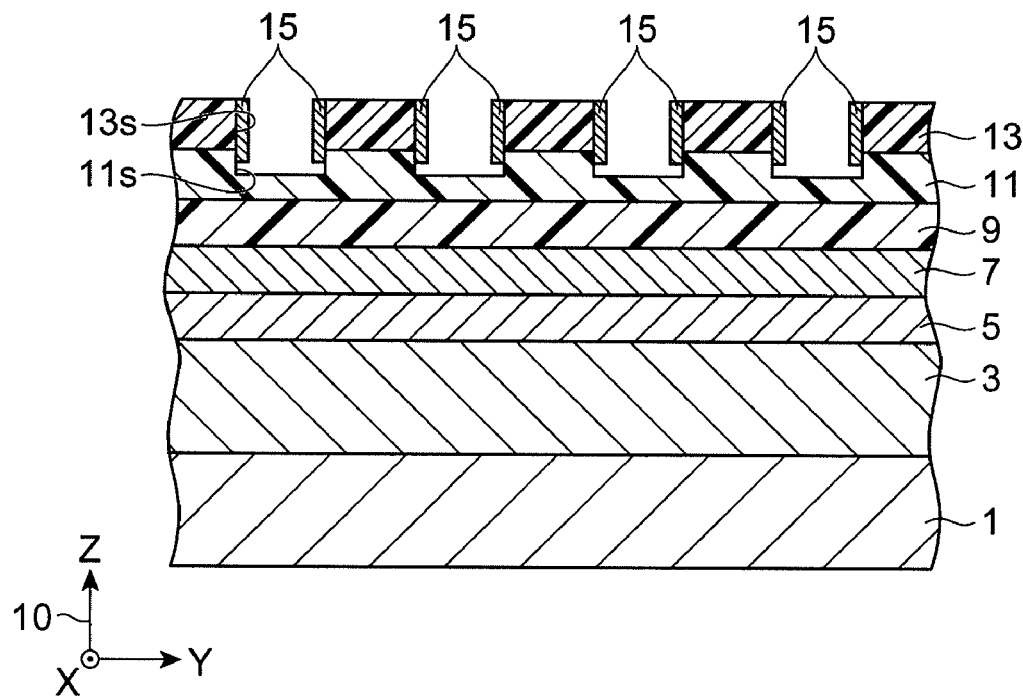
FIGS. 3A and 3B are schematic sectional views showing the method for manufacturing a distributed feedback laser according to this embodiment, the step shown in FIG. 3A being performed after the step shown in FIG. 2B.
Figure 3B:
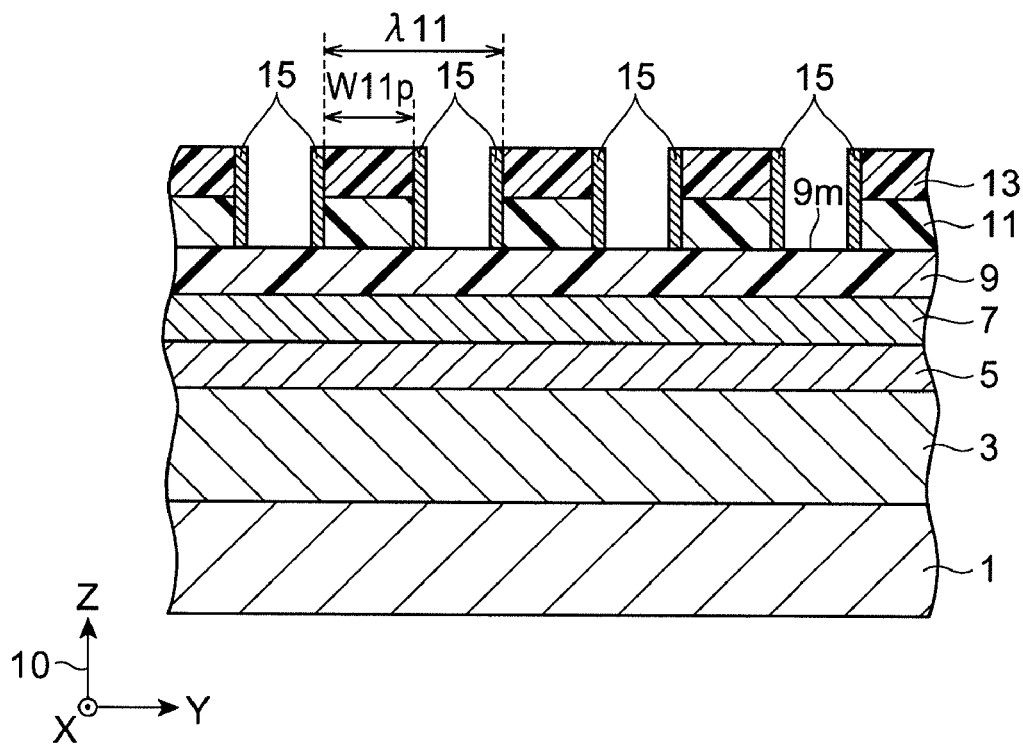

As shown in FIGS. 3A and 3B, the first resin layer 11 is etched by a reactive ion etching using the second resin layer 13 as a mask. FIG. 3A shows that the etching of the first resin layer 11 is still in progress. FIG. 3B shows that the etching of the first resin layer 11 has been completed.

Figure 4:
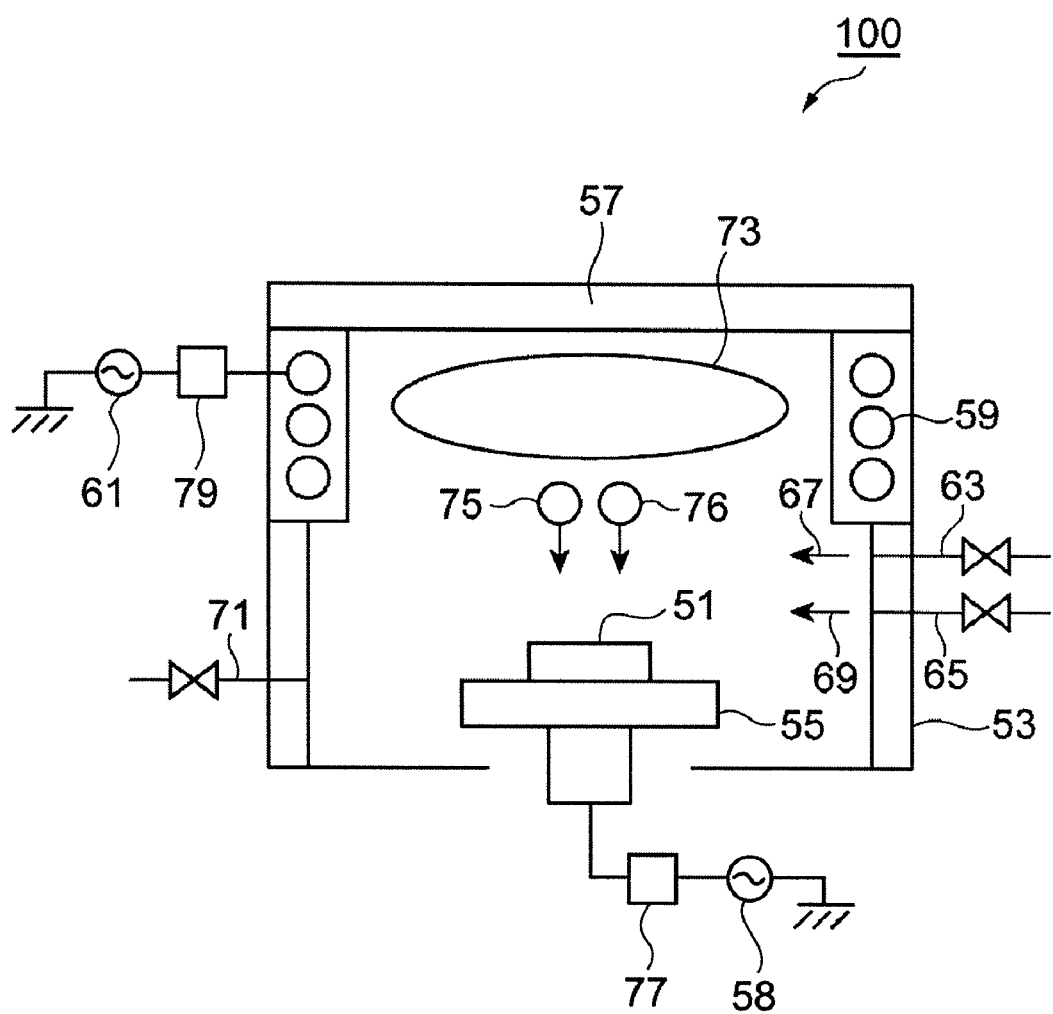
FIG. 4 is a schematic view of a sectional structure of a reactive ion etching apparatus.

The reactive ion etching adopted in this embodiment is described in detail with reference to FIG. 4. FIG. 4 is a schematic view of a sectional structure of a reactive ion etching apparatus. The reactive ion etching apparatus of this embodiment is an inductively coupled plasma (ICP) reactive ion etching apparatus 100. The inductively coupled reactive ion etching apparatus 100 includes a vacuum chamber 53 in which reactive ion etching is performed on a sample 51 subjected to etching. The vacuum chamber 53 includes a lower electrode 55 and an upper electrode 57 that face each other. The upper electrode 57 is grounded. The sample 51 subjected to etching is disposed on the lower electrode 55 so as to be sandwiched between the lower electrode 55 and the upper electrode 57. The lower electrode 55 has a cooling mechanism, which can cool the sample 51 subjected to etching. A high-frequency power source 58 is connected to the lower electrode 55 through a matching circuit 77, and a high-frequency voltage is applied to the lower electrode 55. An induction coil 59 is disposed on the side face of the vacuum chamber 53. An inductively coupled plasma power source 61 is connected to the induction coil 59 through a matching circuit 79, and high-frequency power is supplied to the induction coil 59. Thus, a direct current (DC) bias electric field is generated in the vacuum chamber 53.

Furthermore, the vacuum chamber 53 includes two gas supply pipes 63 and 65 configured to supply an etching gas to the inside and an exhaust pipe 71 configured to eject the etching gas to the outside. At a certain mixing ratio, oxygen ($O_2$) gas 67 and nitrogen ($N_2$) gas 69 are supplied to the inside of the vacuum chamber 53 through the two gas supply pipes 63 and 65. A vacuum pump is connected to the exhaust pipe 71, and the desired degree of vacuum can be maintained in the vacuum chamber 53.

A method for etching the first resin layer 11 is described with reference to FIGS. 3A, 3B, and 4. When the first resin layer 11 is etched, the oxygen gas 67 and the nitrogen gas 69 are supplied to the vacuum chamber 53. Inductively coupled plasma 73 is generated by a high-frequency electric field between the lower electrode 55 and the upper electrode 57. Ions 75 and radicals 76 in the inductively coupled plasma 73 are accelerated due to the bias electric field generated by the induction coil 59 and reach the sample 51 subjected to etching. Thus, as shown in FIG. 3A, the first resin layer 11 is selectively etched in regions that are not masked by the second resin layer 13.

When the first resin layer 11 is etched, carbon atoms in the etched first resin layer 11 react with nitrogen gas in the etching gas, and a reaction product is produced. During etching the first resin layer 11, the lower electrode 55 is cooled by the cooling mechanism, whereby the first resin layer 11 is cooled down to a first temperature lower than or equal to the volatilization temperature of the reaction product. Therefore, as shown in FIG. 3A, a protective layer 15 composed of the above-described reaction product is gradually formed on the side face 13s of the second resin layer 13 and on the side face 11s of the first resin layer 11 formed by etching, from the positive side of a Z axis to the negative side.

Such etching of the first resin layer 11 is performed until part of the surface 9m of the insulating layer 9 is exposed as shown in FIG. 3B. Thus, the first resin layer 11 is patterned so as to have a periodic structural pattern corresponding to the periodic structure of an optical grating 7g to be formed in a later step. Specifically, the patterned first resin layer 11 has a pattern constituted by a plurality of lines that are periodically arranged in the Y axis direction and extend in the X axis direction. The width W11p of the patterned first resin layer 11 in the Y axis direction is substantially equal to the width W7p of a projection of the optical grating 7g to be formed in a later step (refer to FIG. 6A). The width W11p is, for example, 100 to 120 nm. The period λ11 of the patterned first resin layer 11 is substantially equal to the period λ7 of the optical grating 7g to be formed in a later step (refer to FIG. 6A).

During etching the first resin layer 11, the mixing ratio of the oxygen gas and the nitrogen gas is preferably within the range of 1:1 to 1:10 in terms of a partial pressure ratio. When the mixing ratio of the oxygen gas and the nitrogen gas is equal to 1:10 or larger than 1:10, the oxygen gas brought into the plasma state can sufficiently react with the first resin layer 11 during etching the first resin layer 11. Consequently, the first resin layer 11 can be easily etched to a desired depth. When the mixing ratio of the oxygen gas and the nitrogen gas is equal to 1:1 or less than 1:1, a reaction between silicon atoms in the second resin layer 13 and the oxygen gas can be sufficiently suppressed during etching the first resin layer 11. As a result, the production of silicon oxide is suppressed during etching the first resin layer 11. It is found that variation in the shape of the optical grating 7g to be formed in a later step is caused when silicon oxide adheres to the surface 9m of the insulating layer 9 or the like. Consequently, the variation in the shape of the optical grating 7g can be sufficiently suppressed.

The first resin layer 11 is preferably etched at a pressure of 0.1 to 1 Pa. When the pressure is 0.1 Pa or higher, plasma discharge can be sufficiently stabilized. When the pressure is 1 Pa or lower than 1 Pa, the side etching of the side face 11s of the first resin layer 11 can be suppressed because the mean free path of ions and radicals in plasma during etching becomes too long. Thus, by keeping the pressure within the range of 0.1 to 1 Pa during etching the first resin layer 11, the first resin layer 11 can be etched while the plasma discharge is stably maintained and side etching is suppressed.

The reaction product between the carbon atoms and the nitrogen gas is specifically a carbon nitride film or the like formed by depositing CN radicals. The cooling temperature of the first resin layer 11 during etching the first resin layer 11 is preferably 0° C. or less. This is because the protective layer is particularly easily formed on the side face 11s of the first resin layer 11 when the cooling temperature is 0° C. or less.

As shown in FIG. 5A, the protective layer 15 is removed through volatilization by increasing the temperature of the first resin layer 11 upto a temperature higher than or equal to the volatilization temperature of the reaction product. The temperature of the first resin layer is preferably risen at a lower pressure than atmospheric pressure in the vacuum chamber 53 after the process of etching the first resin layer. For example, the volatilization temperature of the reaction product is 0° C. or higher. The temperature of the first resin layer 11 is risen by stopping the cooling of the lower electrode 55 (refer to FIG. 4) or by heating the lower electrode 55 using the heating mechanism providing to the lower electrode 55 (refer to FIG. 4) in the vacuum chamber 53.

Figure 5:
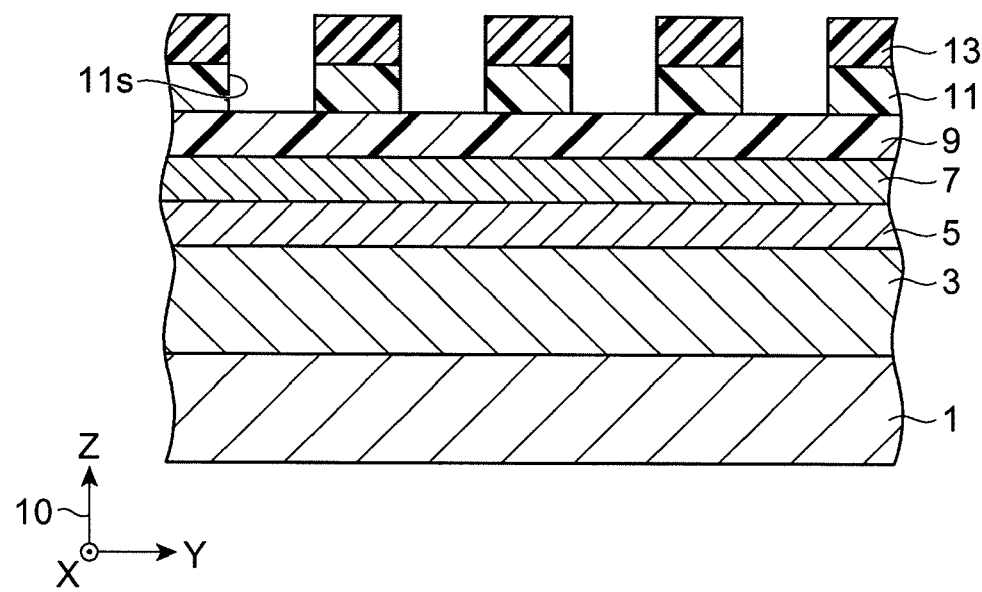
FIGS. 5A and 5B are schematic sectional views showing the method for manufacturing a distributed feedback laser according to this embodiment, the step shown in FIG. 5A being performed after the step shown in FIG. 3B.
Figure 5B:
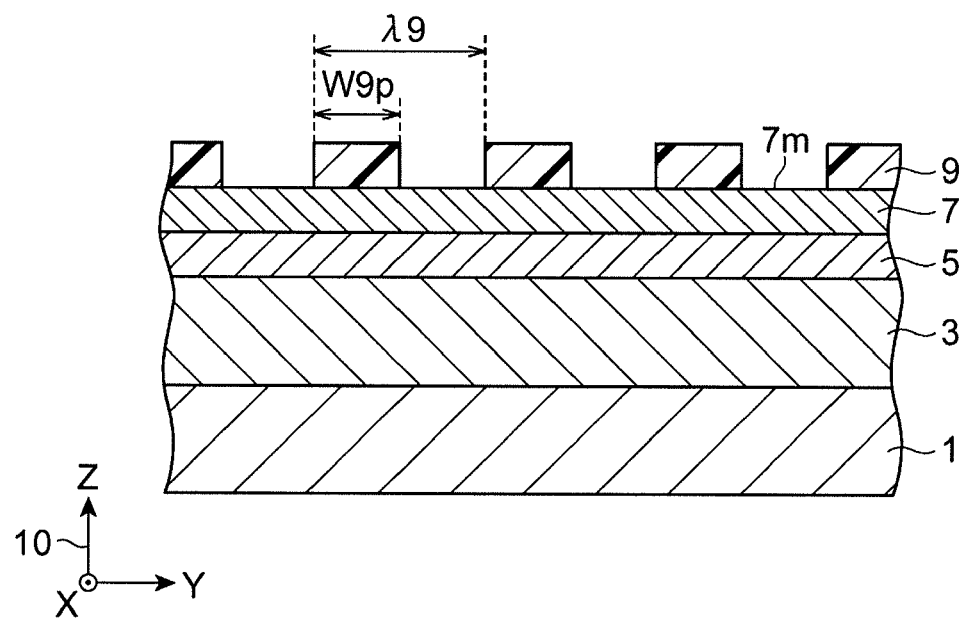

As shown in FIG. 5B, after removing the protective layer 15, the insulating layer 9 is etched using, as masks, the patterned first and second resin layer 11, 13. This etching can be performed by, for example, a reactive ion etching method using $CF_4$ gas as the etching gas.

The insulating layer 9 is etched until the surface 7m of the optical grating layer 7 is exposed. Thus, the insulating layer 9 is patterned so as to have a periodic structural pattern corresponding to the periodic structure of an optical grating 7g to be formed in a later step. Specifically, the patterned insulating layer 9 has a pattern constituted by a plurality of lines that are periodically arranged in the Y axis direction and extend in the X axis direction. The width W9p of the patterned insulating layer 9 in the Y axis direction is substantially equal to the width W7p of a projection of the optical grating 7g to be formed in a later step (refer to FIG. 6A). The width W9p is, for example, 100 to 120 nm. The period λ9 of the patterned insulating layer 9 is substantially equal to the period λ7 of the optical grating 7g to be formed in a later step (refer to FIG. 6A). When the insulating layer 9 is etched, part of the second resin layer 13 or the entire second resin layer 13 is also etched at the same time. Subsequently, the first resin layer 11 is removed (if the second resin layer 13 is still left, the left second resin layer 13 and the first resin layer 11 are removed).

Figure 6A:
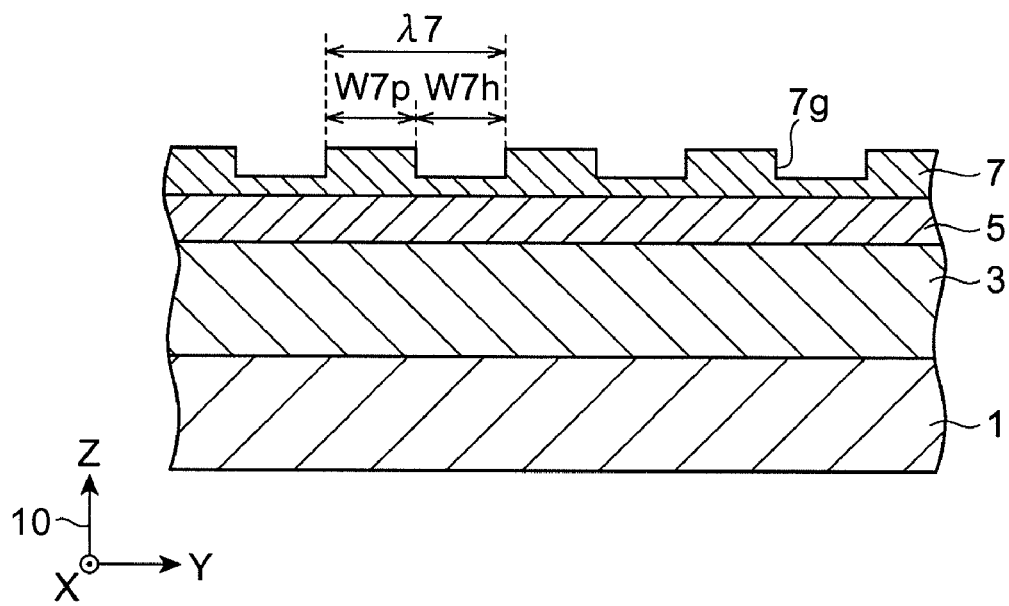
FIGS. 6A and 6B are schematic sectional views showing the method for manufacturing a distributed feedback laser according to this embodiment, the step shown in FIG. 6A being performed after the step shown in FIG. 5B.

As shown in FIG. 6A, the optical grating layer 7 is etched to the middle of the thickness thereof using the patterned insulating layer 9 as a mask. This etching can be performed by, for example, a reactive ion etching method using a mixed gas of methane gas and hydrogen gas as the etching gas. Thus, an optical grating 7g having a line-and-space pattern is formed on the optical grating layer 7. Specifically, the line-and-space pattern of the optical grating 7g includes a line portion that extends in the X axis direction and a space portion that extends in the X axis direction. The line portion and the space portion are alternately and periodically arranged in the Y axis direction. The width W7p of the line portion in the Y axis direction is, for example, 100 to 120 nm. The period λ7 of the line-and-space pattern of the optical grating 7g is, for example, 200 to 240 nm.

Figure 6B:
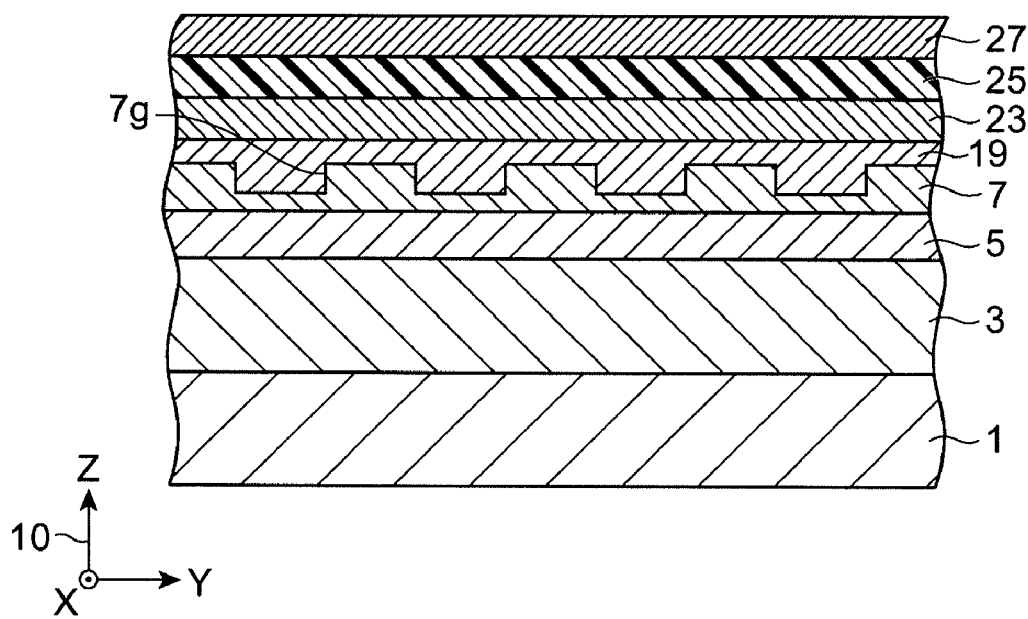

As shown in FIG. 6B, a filling layer 19, a contact layer 23, an insulating layer 25, and a resist layer 27 are formed on the optical grating layer 7 in that order.

The filling layer 19 and the contact layer 23 are grown by, for example, a metal-organic chemical vapor deposition (MOCVD) method. The optical grating 7g is filled with the filling layer 19. The filling layer 19, for example, is made of p-type InP and the filling layer 19 constitutes an upper cladding layer. The contact layer 23 is composed of, for example, a group III-V compound semiconductor such as second conductive-type InGaAs. The insulating layer 25 is formed by, for example, a plasma vapor deposition method. The insulating layer 25 is composed of, for example, silicon oxide ($SiO_2$) or silicon nitride (SiN). The resist layer 27 is formed on the insulating layer 25 by spin coating.

Figure 7:
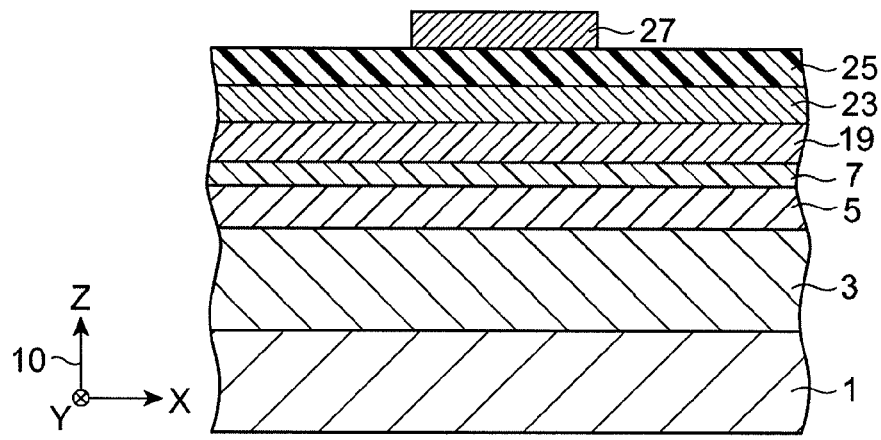
FIGS. 7A, 7B, and 7C are schematic sectional views showing the method for manufacturing a distributed feedback laser according to this embodiment, the step shown in FIG. 7A being performed after the step shown in FIG. 6B.
Figure 7B:
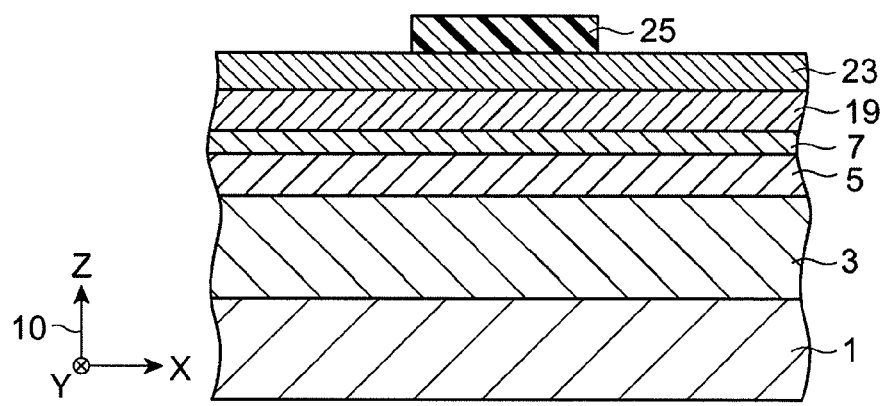

As shown in FIG. 7A, the resist layer 27 is patterned by a photo-etching method so as to have a pattern that extends in the Y axis direction. Subsequently, as shown in FIG. 7B, the insulating layer 25 is patterned using the patterned resist layer 27 as a mask so as to have a pattern that extends in the Y axis direction, and the resist layer 27 is removed.

Figure 7C:
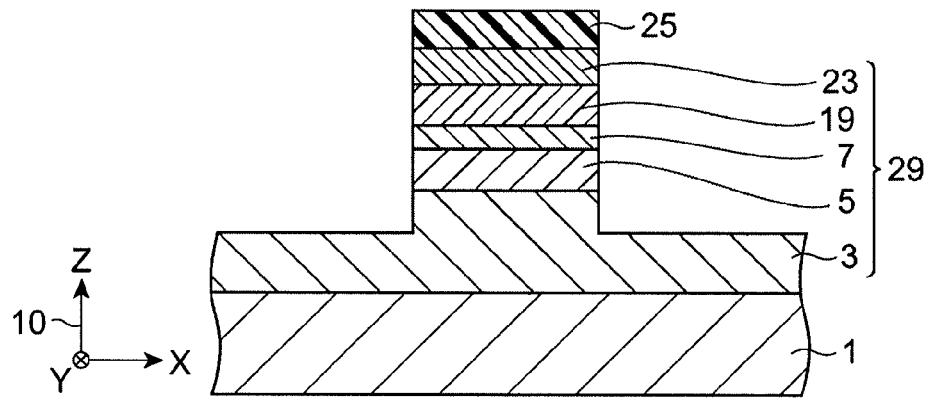

As shown in FIG. 7C, etching is performed from the surface of the contact layer 23 to the middle of the thickness of the lower cladding layer 3 using the patterned insulating layer 25 as a mask. Thus, a semiconductor mesa structure 29 is formed.

Figure 8A:
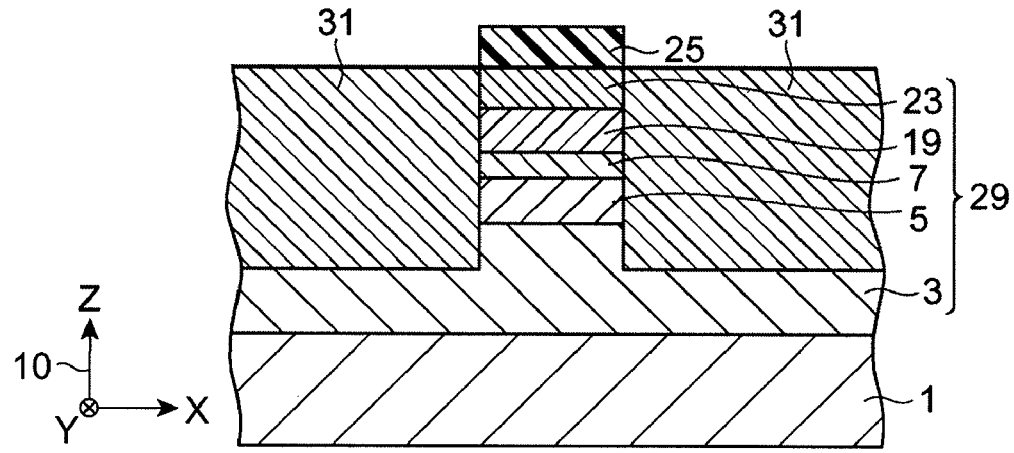
FIGS. 8A, 8B, and 8C are schematic sectional views showing the method for manufacturing a distributed feedback laser according to this embodiment, the step shown in FIG. 8A being performed after the step shown in FIG. 7C.

As shown in FIG. 8A, a group III-V compound semiconductor region 31 is selectively grown by, for example, a metal-organic chemical vapor deposition (MOCVD) method using the patterned insulating layer 25 as a mask. Thus, the semiconductor mesa structure 29 is filled with the group III-V compound semiconductor region 31. The group III-V compound semiconductor region 31 can include, for example, a second conductive-type InP layer and a first conductive-type InP layer stacked on the second conductive-type InP layer or a semi-insulating semiconductor layer made of Fe-dope InP.

Figure 8B:
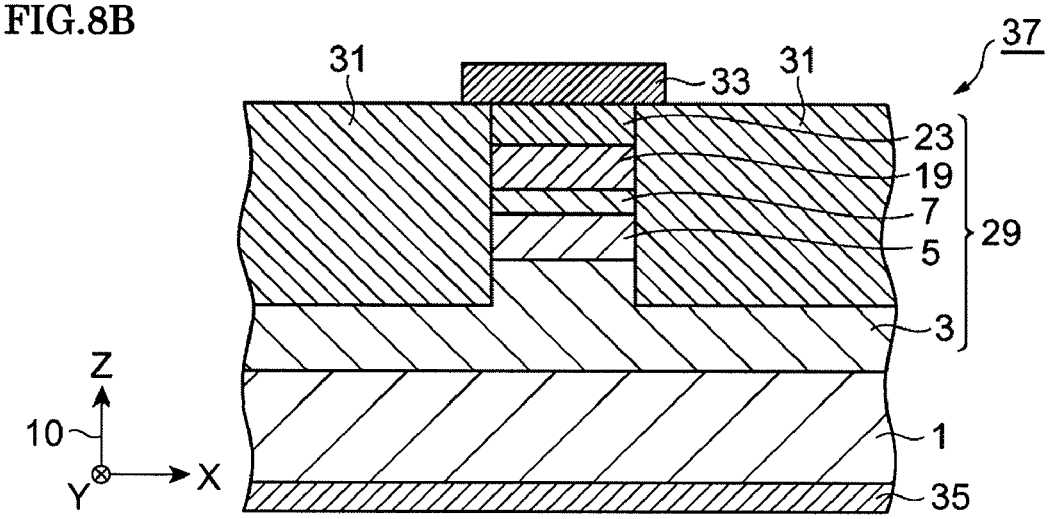

As shown in FIG. 8B, the insulating layer 25 is removed, an upper electrode 33 is formed on the contact layer 23, and a lower electrode 35 is formed on the back of the semiconductor substrate 1, whereby a substrate product 37 is formed.

Figure 8C:
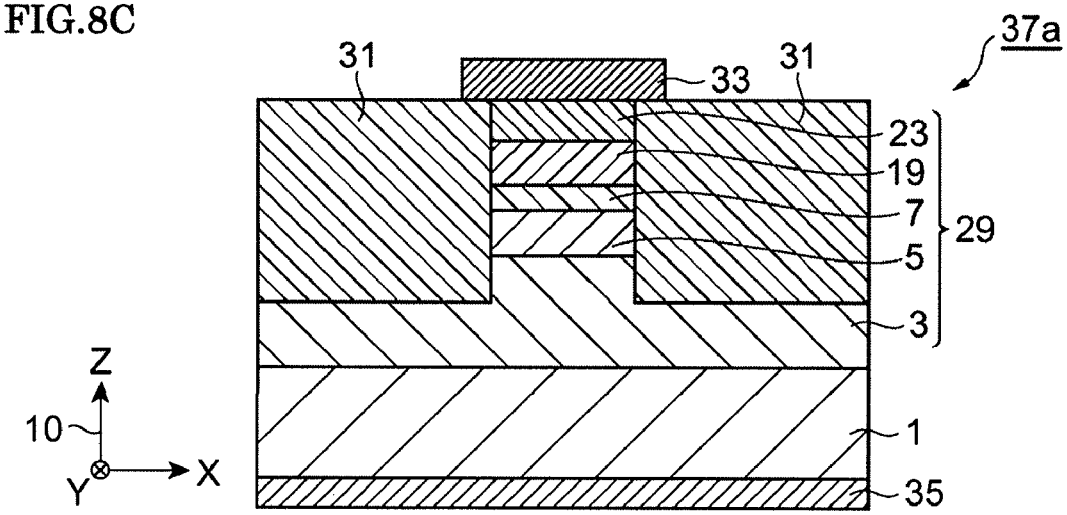

As shown in FIG. 8C, the substrate product 37 is cut into chips, whereby a distributed feedback laser 37a is completed.

According to the above-described method for manufacturing the distributed feedback laser 37a of this embodiment, variation in the shape of an optical grating can be suppressed because of the following reasons.

According to the method for manufacturing the distributed feedback laser 37a of this embodiment, for etching the first resin layer 11, a mixed gas of the oxygen gas 67 and the nitrogen gas 69 is used as the etching gas of the reactive ion etching (refer to FIG. 4). Therefore, the reaction between silicon in the second resin layer containing Si 13 and the oxygen gas 67 is suppressed compared with the case where only oxygen gas is used for the etching gas. Thus, the production of silicon oxide is reduced. Furthermore, at least part of silicon oxide produced is removed due to a sputtering effect provided from the nitrogen gas 69 brought into the plasma state. These suppress the variation in the shape of the optical grating 7g (refer to FIGS. 6A and 6B) caused by the production of silicon oxide.

According to the method for manufacturing the distributed feedback laser 37a of this embodiment, in the step of patterning the first resin layer 11, the protective layer 15 composed of a reaction product between carbon atoms and the nitrogen gas 69 is formed on the side face 11s of the etched first resin layer 11 (refer to FIGS. 3A and 3B). Therefore, the side etching of the first resin layer 11 caused by oxygen plasma is suppressed. This suppresses the variation in the shape of the optical grating 7g (refer to FIGS. 6A and 6B) caused by side etching.

The inventors of the present invention have found that the protective layer 15 composed of the reaction product between carbon atoms and the nitrogen gas 69 can be volatilized by increasing temperature. Thus, in the method for manufacturing the distributed feedback laser 37a according to this embodiment, after etching the first resin layer 11, the protective layer 15 is removed by increasing the temperature of the first resin layer 11 to a temperature higher than or equal to the volatilization temperature of the reaction product (refer to FIGS. 3B and 4A). Therefore, variation in the pattern of the insulating layer 9 caused by the presence of the protective layer 15 is suppressed in the etching of the insulating layer 9 performed later (refer to FIGS. 5A and 5B), which suppresses the variation in the shape of the optical grating 7g (refer to FIGS. 6A and 6B).

For the reasons described above, variation in the shape of the optical grating 7g can be suppressed by the method for manufacturing the distributed feedback laser 37a according to this embodiment.

The present invention is not limited to the above-described embodiment, and various modifications can be made.

For example, in the above-described embodiment, the etching of the first resin layer 11 is performed using the inductively coupled reactive ion etching apparatus 100 (refer to FIG. 4), but the etching may be performed using a reactive ion etching apparatus such as a parallel-plate reactive ion etching apparatus or an electron cyclotron resonance reactive ion etching apparatus.

In the above-described embodiment, after the first resin layer 11 is formed on the surface 9m of the insulating layer 9 and patterned so as to have a line-and-space pattern, the second resin layer 13 is formed such that the recesses of the line-and-space pattern are filled (refer to FIGS. 2A and 2B). However, the present invention is not limited to this embodiment. For example, after a first resin layer not containing Si and a second resin layer containing Si are entirely formed on the surface 9m of the insulating layer 9 in that order and the second resin layer is patterned so as to have the line-and-space pattern shown in FIG. 2B, the step shown in FIG. 3A may be performed.

In the above-described embodiment, the optical grating 7g is formed on the active layer 5 (FIG. 6B). However, the optical grating 7g may be formed in a semiconductor layer closer to the semiconductor substrate 1 relative to the active layer 5.

In the preferred embodiments, the principles of the present invention have been described with reference to the drawings, but it will be apparent to a person skilled in the art that the present invention can be modified in terms of arrangement and details without departing from the principles. The present invention is not limited to the specific structures disclosed in the embodiments. Therefore, the present invention embraces all modifications and changes coming within the scope of Claims and the spirit.

What is claimed is:

1. A method for manufacturing a semiconductor optical device having an optical grating, comprising the steps of:
    forming a semiconductor layer on a semiconductor substrate;
    forming an insulating layer on the semiconductor layer;
    forming a first resin layer not containing silicon (Si) on the insulating layer;
    forming a second resin layer containing silicon (Si) on the first resin layer, the second resin layer having a pattern corresponding to the optical grating;
    etching the first resin layer using the second resin layer as a mask by a reactive ion etching that uses a mixed gas of oxygen ($O_2$) and nitrogen ($N_2$), the first resin layer being cooled down to a first temperature during etching to form a protective layer on a side face of the etched first resin layer;
    increasing the temperature of the first resin layer upto a second temperature higher than the first temperature;
    etching the insulating layer using the patterned first resin layer as a mask; and
    forming the optical grating on the semiconductor layer by etching the semiconductor layer using the patterned insulating layer as a mask.

2. The method according to claim 1, wherein, in the step of etching the first resin layer, the protective layer is composed of a reaction product between carbon atoms and the nitrogen gas.

3. The method according to claim 2, wherein the first temperature is lower than or equal to the volatilization temperature of the reaction product and the second temperature is higher than or equal to the volatilization temperature of the reaction product.

4. The method according to claim 1, wherein, in the step of increasing the temperature of the first resin layer, the protective layer formed on the side face of the etched first resin layer is volatilized after exposing a surface of the insulating layer in the step of etching the first resin layer.

5. The method according to claim 1, wherein, in the step of increasing the temperature of the first resin layer, the temperature of the first resin layer is risen at a lower pressure than atmospheric pressure.

6. The method according to claim 1, wherein, in the step of increasing the temperature of the first resin layer, the temperature of the first resin layer is risen in a reactive ion etching apparatus after the step of etching the first resin layer.

7. The method according to claim 1, wherein, in the step of etching the first resin layer, the mixing ratio of the oxygen gas and the nitrogen gas is within a range of 1:1 to 1:10 in terms of a partial pressure ratio.

8. The method according to claim 1, wherein the first temperature is lower than or equal to 0° C. and the second temperature is higher than or equal to 0° C.

9. The method according to claim 1, wherein, in the step of etching the first resin layer, the first resin layer is etched at a pressure of 0.1 to 1 Pa.

10. The method according to claim 1, wherein, in the step of forming the first resin layer on the insulating layer, the first resin layer has a flattened surface by compensating a roughness of the surface of the semiconductor substrate.

11. The method according to claim 1, wherein the step of forming the second resin layer includes the steps of:
    forming the pattern corresponding to the optical grating on the first resin layer by etching the first resin layer to the middle of the thickness thereof, the pattern having periodic recesses;
    forming the second resin layer on the first resin layer; the second resin layer fully filling the periodic recesses of the first resin layer;
    etching the second resin layer until a surface of the first resin layer is exposed.

* * * * *